United States Patent [19]

Carlon et al.

[11] 4,270,084
[45] May 26, 1981

[54] APPARATUS AND METHOD FOR DETERMINING ELECTRICAL CONDUCTIVITY OF WATER VAPOR

[75] Inventors: Hugh R. Carlon; Rex M. Pritt, both of Bel Air, Md.

[73] Assignee: The United States of America as represented by the Secretary of the Army, Washington, D.C.

[21] Appl. No.: 55,716

[22] Filed: Jul. 9, 1979

[51] Int. Cl.$^3$ .......................................... G01R 27/02
[52] U.S. Cl. ............................... 324/65 R; 324/71 R
[58] Field of Search ................. 324/65 R, 65 P, 71 R; 73/73, 61.3

[56] References Cited

U.S. PATENT DOCUMENTS

| | | | |
|---|---|---|---|
| 2,636,927 | 4/1953 | Durham | 324/65 R |
| 3,553,576 | 1/1971 | Petit Jean et al. | 324/65 R |
| 3,990,066 | 12/1976 | Malmgren | 324/65 R X |

FOREIGN PATENT DOCUMENTS 2701197  7/1978  Fed. Rep. of Germany ........ 324/65 R

*Primary Examiner*—Stanley T. Krawczewicz
*Attorney, Agent, or Firm*—Nathan Edelberg; Robert P. Gibson; Max Yarmovsky

[57] ABSTRACT

An apparatus and method are disclosed for measuring the conductivity or number of water ion clusters present in a moist air environment. A test chamber is utilized for operatively simultaneously holding a "dummy" reference cell and a "large" conductivity cell having substantially the same leakage resistance. The cells are designed to have "cell factor" ratios substantially different from each other. A D.C. power source with an in series vacuum-tube voltmeter is used to alternately measure the voltage drop of each cell under the similar variable ambient conditions. The conductivity or number of ion cluster present in the test environment is determined by a calculation using voltage compensated values and by graphical extrapolation.

11 Claims, 6 Drawing Figures

APPARATUS AND METHOD FOR DETERMINING ELECTRICAL CONDUCTIVITY OF WATER VAPOR

GOVERNMENTAL INTEREST

The invention described herein may be manufactured, used and licensed by or for the Government for Governmental purposes without the payment to us of any royalty thereon.

BACKGROUND OF THE INVENTION

For a long time it was believed that the infrared absorbtion spectrum of water "vapor" could be explained by interatomic vibrations or by modes of individual water molecules, hereinafter referred to as "monomers". Recently it has been determined that this absorption phenomenon cannot be adequately explained by monomers but rather was due to molecular aggregates or "clusters" of wter molecules in a vapor phase.

It has been known that substances which absorb infrared radiation also emit radiation. The infrared emission spectra of water vapor, and especially that of steam, as reported by the present applicant in Infrared Physics 19, 49 (1979), in an article entitled "Variations in Emission Spectra from Warm Water Fogs", show features which indicate that water cluster species are present. These spectra may be measured by infrared radiometers.

Infrared systems are used in a wide variety of applications today. Such systems are used in missile guidance, surveillance, thermal imaging, and night vision apparatus. In addition there has been interest shown in the use of aerosols and smokes in infrared and electronic countermeasure applications.

In the applicant's infrared radiometric measurements of saturated steam, reported in the article above, intense spectral activity was observed which gave evidence of large water cluster populations. This article indicated that a direct proportionality exists between ion populations in water vapor or moist air and infrared spectral activity. The aforementioned tests also indicated that it would be possible to measure electrical conductivity due to ions in water vapor. These ions would have similar dependencies upon vapor pressure and temperature as the infrared spectral activity had.

The problem with prior art devices which used standard test instrument for measuring electrical conductivity of moist air was that frequently there were errors due to leakage across the insulators of the measuring device. Prior art devices, like the Gerdien tube, which utilized tubes or channels frequently had very poor ratios of electrode area to electrode spacing. Thus the prior art devices used for measuring electrical conductivity in moist air were insensitive, subject to errors, and often required very specialized test equipment in order to perform satisfactorily in a moist environment.

PRIOR ART STATEMENT

There is no known pertinent prior art.

SUMMARY OF THE INVENTION

The present invention relates to an apparatus and method for measuring the conductivity or ion clusters present in a moist air environment. A "large" cell, which comprises a plurality of parallel insulator spaced metal plates alternately electrically connected together by bus bars in capacitor like configuration, is measured for its resistance in a test chamber containing the moist air environment under evaluation. A "dummy" cell, having identical insulator configuration to the aforementioned "large" cell has identical plate insulated spacings but a total plate area substantially smaller than the plate area "large" cell. The "cell factor", that is the ratio of the plate spacing to plate area, of the "dummy" cell to the "large" cell in 25 times smaller. The resistance of both cells are measured in the test chamber under the same environmental conditions. The contribution due to electrical leakage in both cells is substantially identical, while the contribution due to conductivity of the vapor or moist air in the "large" cell is 25 times more sensitive than in the "dummy" cell. The present device, utilizing a process of testing to be hereinafter further described, allows the contribution due to ions in a vapor to be accurately determined under varying ambient conditions.

An object of the present invention is to provide an apparatus having good sensitivity for measuring the electrical vapor conductivity and for determining the number of ion clusters present in a moist air sample.

Another object of the present invention is to provide an apparatus and method for measuring the electrical conductivity and the number of ion clusters present in a moist air environment versus humidity and temperature using simple commonplace instrument.

Another object of the present invention is to provide a compensated electrical vapor conductivity cell which insures the measurement of electrical conductivity and ion clusters present in moist air or vapors with greater sensitivity and freedom from leakage errors.

A further object of the present invention is to provide an apparatus and method for reliably measuring the electrical conductivity and to determine the number of ion clusters in a moist air environment which can operate at temperatures up to 100° C. and at saturation humidity.

For a better understanding of the present invention, together with other and further objects thereof, reference is made to the following descriptions taken in connection with the accompanying drawings.

BRIEF DESCRIPTION OF THE DRAWINGS

Throughout the following description like reference numerals are used to denote like parts of the drawings.

DESCRIPTION OF THE PREFERRED EMBODIMENT

Figure 1:
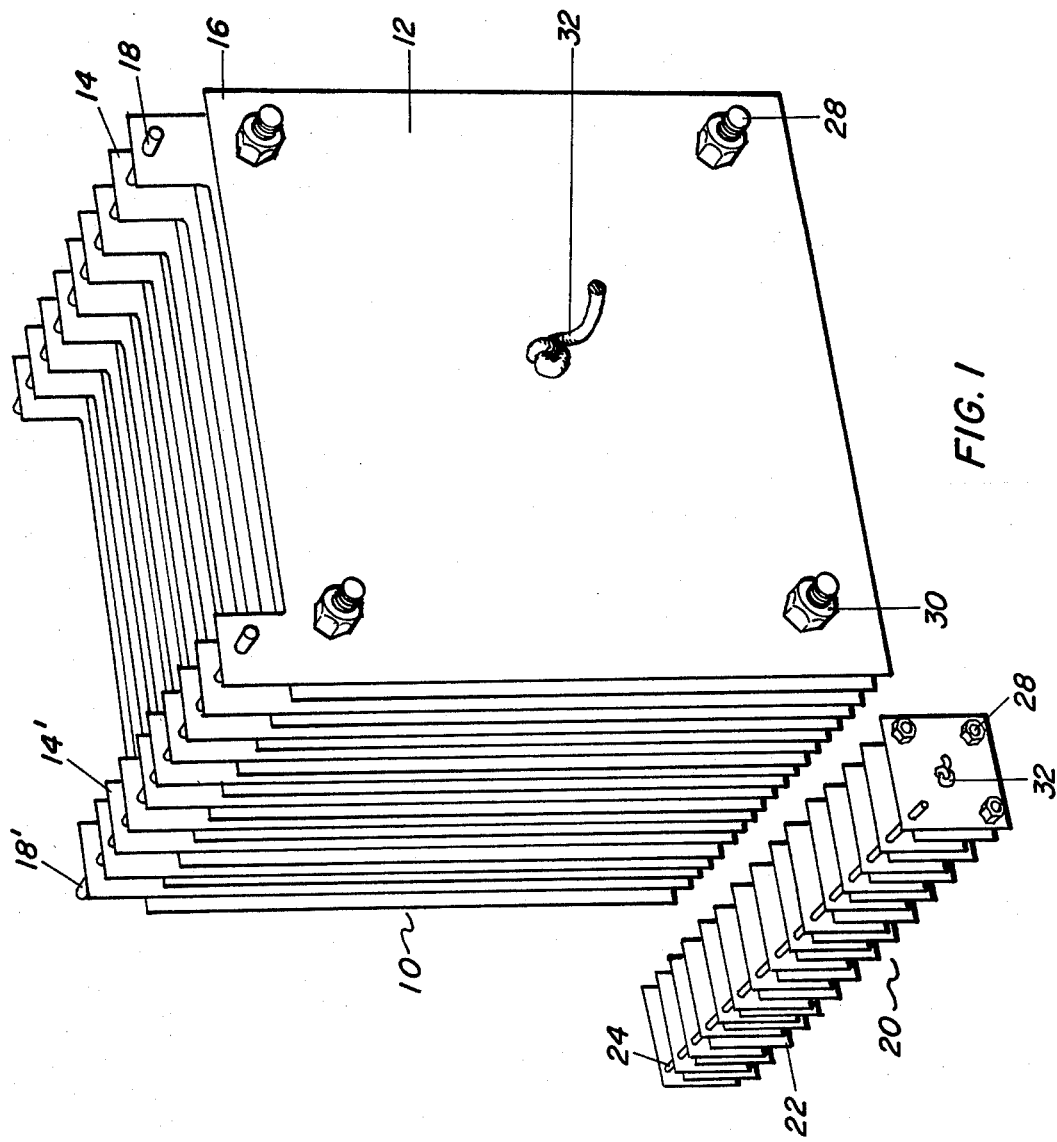
FIG. 1 is an isometric view of the "large" sample cell and the "small" reference cell.
Figure 2:
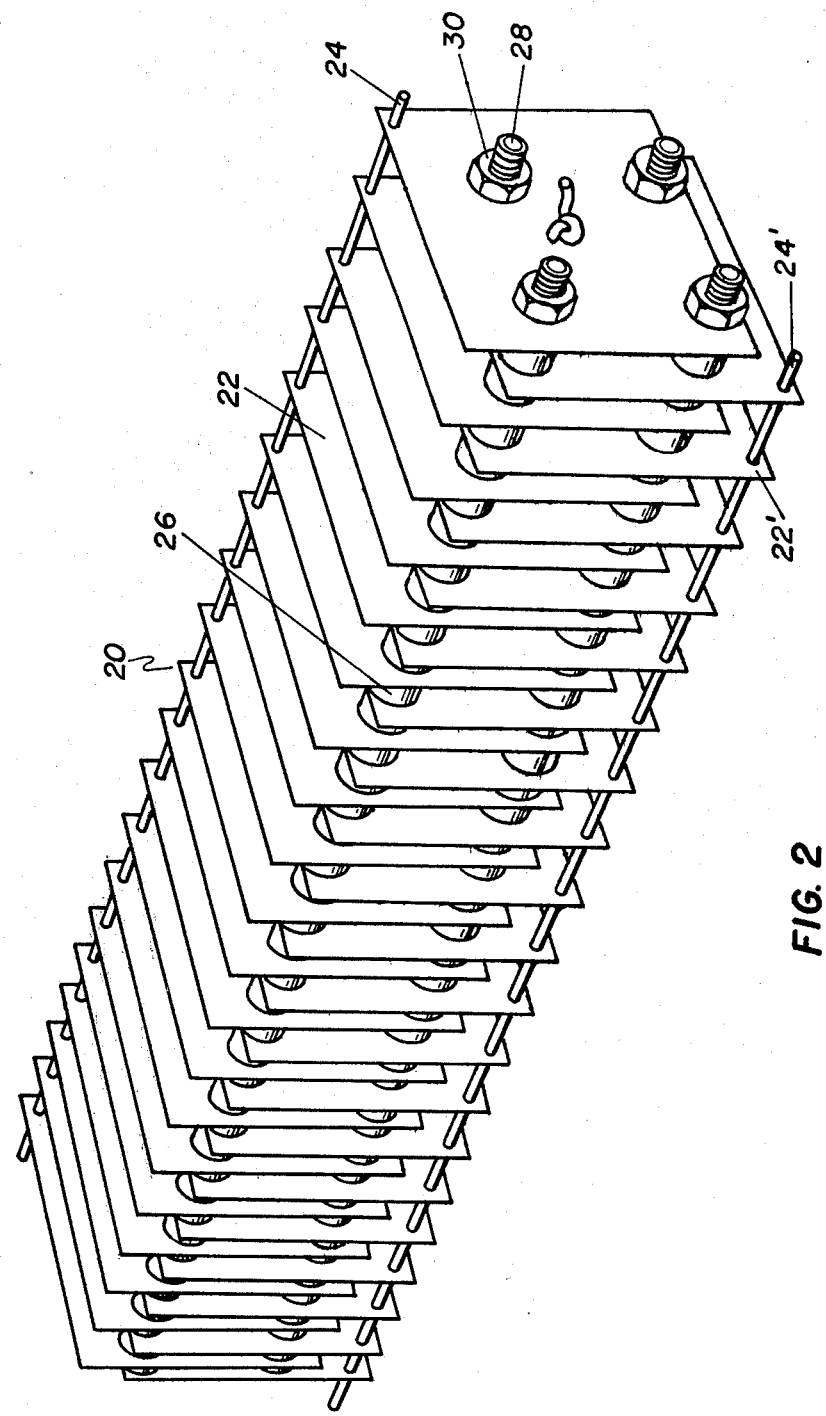
FIG. 2 is a close-up isometric view of the reference cell.

Referring now to FIGS. 1 and 2 the "large" conductivity cell 10 comprises fourty 1-mm-thick steel plates 12. Each plate 12 is 41 centimeters square with a small tab 14, 14'0 extending from a top corner 16. Adjacent plates 12 are spaced at an average 0.66 centimeters apart. The tabs 14, 14' on adjacent plates are alternated on one top corner and then another top corner. This configuration enables alternate plates 12 to be electrically connected by wire rods or "bus bars" 18 and 18'. The bus bars 18 and 18' are slidably disposed in axially aligned holes that have been drilled in the tabs 14 and 14'. The bus bars 18, 18' are then soldered to each tab so that they are fixedly held thereto. Thus twenty plates 12 are electrically connected to one bus bar 18 and interleaved with twenty plates which are electrically connected to the other bus bar 18'. The aforementioned construction is similar to the type of construction used to hold the plates of a liquid storage battery together.

A "dummy" cell 20 has a plurality of rectangular shaped steel plates 22, 22' which are parallel to each other and alternately stacked first to one side and then to the other side to create a square overlap area and to facilitate the soldering of bus bars 24 and 24' to plate 22 and 22' respectively.

The plates 18, 18' and 22, 22' of the "large" conductivity cell 10 and the "dummy" cell 20, respectively, are spaced apart by identical insulator spacers 26 which are 0.66 cm thick, and by support rods 28. The "large" conductivity cell 10 and the "dummy" cell 20 each have four similarly positioned resin-impregnated fiber support rods 28 located in support rod holes proximate to the cell corners. The rods 28 structurally help support the cell plates 12 and 22, 22'. The annularly shaped insulator spacers 26, made of such material as nylon, are operatively disposed between each plate pair. The ends of rods 28 are threaded to carry nylon nuts 29 which are tightened thereon to give rigidity to the cells. A fifth set of annular shaped nylon spacers, not shown, are positioned intermediate each plate. Since the fifth spacers are used only to keep the plates from touching and not for structural support, they are carried on a length of TEFLON tubing 32 which passes through a central plate hole. The tubing 32 is knotted at the end of each cell. Thus, there are a total of five insulator spacer elements between each cell, four on the rods 28 and one on the tubing 32.

The "dummy" cell plate dimensions are 6.5 by 7.5 cm. Each plate is alternately positioned so that it overlaps the adjacent plate over a 6.5 by 6.5 cm² area. The total effective "dummy" cell plate area in the preferred embodiment is 2600 cm². The "large" conductivity cell has been designed so that the "cell factor" or ratio of plate spacing (0.66 cm) to plate area ($6.6 \times 10^4$ cm²) is in the order of $10^{-5}$ centimeters. As previously stated the "cell factor" of the "dummy" cell 20 is approximately 25 times smaller than the "large" cell because of the difference in plate areas.

Figure 4:
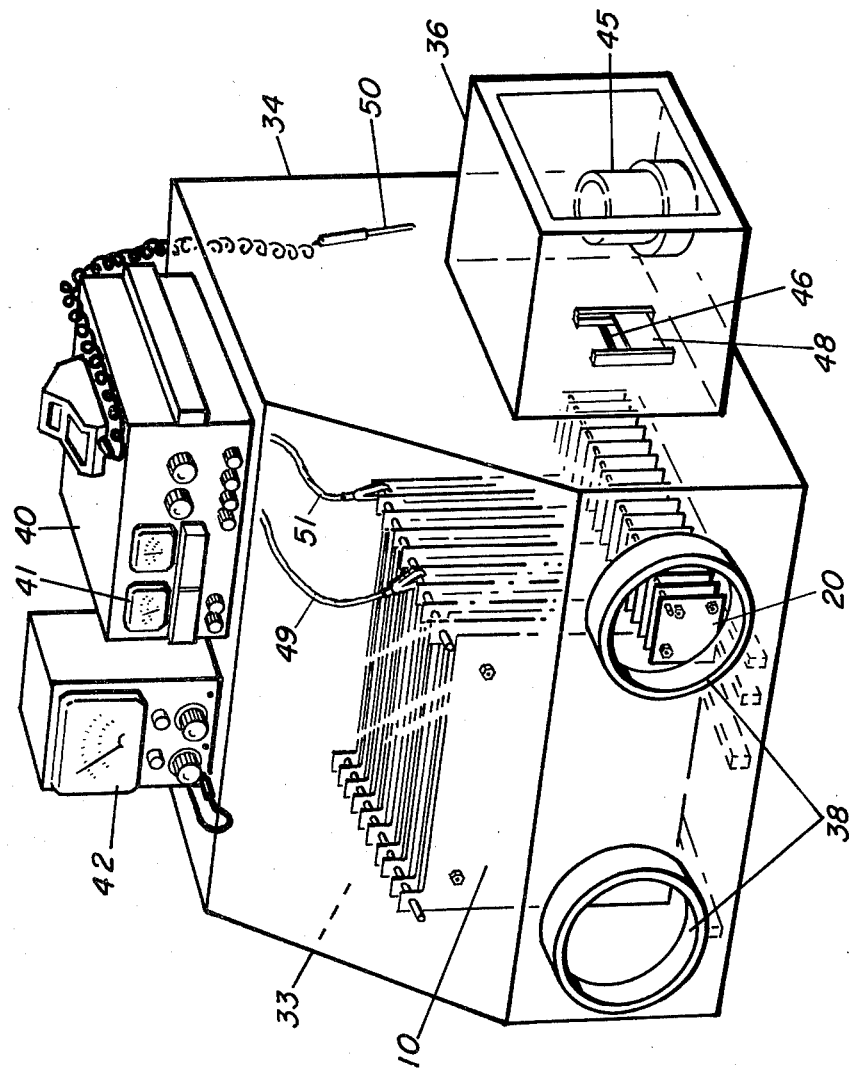
FIG. 4 is an isometric view of the cells positioned in a conductivity test chamber.
Figure 3:
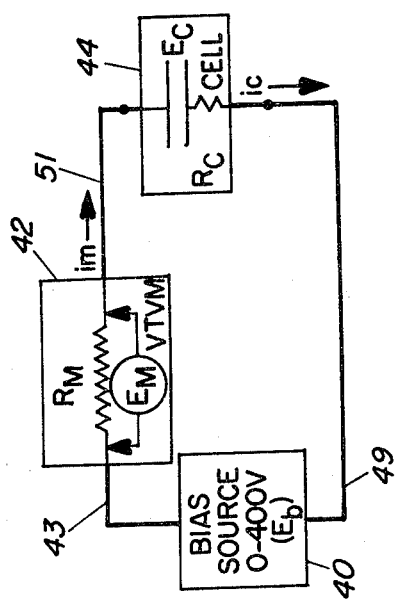
FIG. 3 is a schematic block diagram of the circuit used for measurement of cell resistance.

Referring now to FIGS. 3 and 4, when the resistance or conductivity of the cells 10 and 20 are desired to be measured they are placed in the main chamber section 33 of an environmental test chamber 34. Test chamber 34 has an access compartment section 36 proximately positioned adjacent to one side for the introduction of steam. Glove ports 38 permit making electrical connections to the cells 10 and 20. The gloves have been removed in this instance in FIG. 4 for clarity of illustration. A low voltage variable D.C. bias source 40 is electrically connected in series with a high impedance vacuum-tube type voltmeter 42 first output electrical conductor 43 and with one terminal of the cell 44 via second output electrical conductor 49. The other terminal of cell 44 is electrically connected to voltmeter 42 by electrical conductor 51.

In operation when it is desired to do an electrical conductivity test, the reference or compensating cell 20 is positioned closer to the point of steam entry than is the "large" conductivity cell 10. In this position the compensation "dummy" cell 20 is placed in the position where condensation, if it occurred at all, would affect the insulators 26 of the compensating "dummy" cell 20 to a greater extent than the insulators (not shown) of the "large" cell 20. In this manner conductivities attributed to moist air are always conservative if, in fact, any condensation occurred.

Water is then boiled in container 45 at 100° C., at atmospheric pressure, in access compartment 36. The water vapor or steam generated by the boiling water is admitted into the test chamber 34 through a slit 46 in a common wall 47 shared by main chamber section 33 and access chamber 36. The vapor is first passed over the compensating "dummy" cell 20 and then over the "large" sample conducting cell 10. When sufficient water vapor or steam has been generated and admitted to test chamber 34, the slit 46 is closed by slidable slit cover 48 and the test chamber 34 is sealed at atmospheric pressure. The moist air is then heated by a hot plate (not shown) operatively disposed in the chamber to obtain the amount of humidification desired. Each moist air sample is allowed to equilibrate before readings are recorded. The amount of water vapor permitted to enter test chamber 34 is adjusted to cause about a one degree increase in temperature as measured by thermal couple sensor element 50, located proximate to cells 10 and 20. The resistances $R_c$ of both cells 10 and 20 respectively are repetitively determined by alternatively substituting the cells 10 and 20 in the test circuit shown in block 44 of FIG. 3 and recording the potential $E_M$ indicated by the vacuum tube voltmeter 42 and noting the voltage $E_b$ which the bias voltage 40 is set at. Substracting the voltage $E_M$ indicated by the voltmeter 42 from the bias voltage $E_b$ reading indicated on voltage output meter 41 will determine what the cell voltage $E_c$ 44 is at for a particular humidity environmental condition. Because this method utilizes a D.C. measurement, that is zero frequency, capacitive reactance and phase angle need not be considered. Since, $i_m = 1_c$ and $$\frac{E_M}{R_M} = \frac{E_c}{R_c}$$

where
$R_M = 11$ megohms
$i_m$ = current flowing through $R_M$
$1_c$ = current flowing through $R_c$
then the cell resistance $$R_c = \frac{E_c R_M}{E_M} = \frac{(E_b - E_M) R_M}{E_M}$$

Thus when the resistance of either cell is determined (resistance being the reciprocal of conductance or conductivity), the contribution due to electrical leakage in both cells is substantially identical, while the contribution due to conductivity of the vapor or moist air between the plates is different by 25 times. This allows the contributions due solely to ions in the vapor to be determined. The bias voltage $E_b$ is normally kept below 200 volts, where it has been shown that Ohm's Law holds (i.e., new ions are not generated in the vapor by the applied bias voltage), and the cell resistance $R_c$ is obtained by the simple ratio according to the division of voltage between the cell 44 and the vacuum-tube voltmeter 42. The "large" cell 10, under typical ambient conditions, has a DC resistance value in excess of 1000 megohms which is partially due to insulator leakage.

Figure 5:
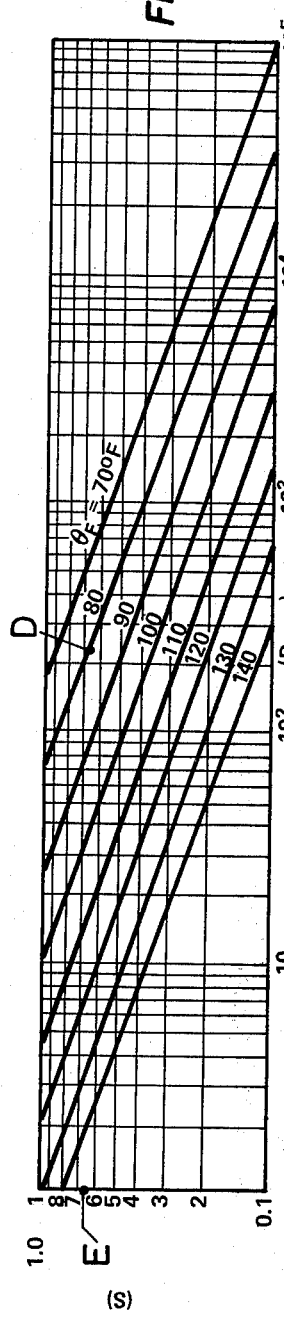
FIG. 5 is a plot of the theoretical value of resistance of a conductivity cell as a function of temperature and saturation ratio.

The theoretical expected value of resistance of the "large" cell 10 due to the vapor between the plates only (the leakage having been compensated for by the "dummy" cell 20 resistance reading) is known from design criteria as a function of temperature and fractional relative humidity or "saturation ratio"(S) and is plotted in FIG. 5. For singly-charged ions in the vapor phase the current density j may be shown to be:

$$j = N\eta \nu E \quad (1)$$

where
$N = $ ions/cm$^3$
$E = $ electric field strength (v/cm)
$\eta = $ value of electronic charge ($1.6 \times 10^{-19}$ coulombs)
$\mu = $ the ion mobility which for clusters of 10-12 water monomers is
1-2 cm$^2$/volt-sec.

The electrical resistance ($R_M$) is related to N by the expression:

$$N = \frac{L}{A} \frac{10^{-6}}{R_M \eta \mu} \quad (2)$$

where
L/A = cell factor or ratio of cell plate spacing to area and is a key design parameter for the present vapor conductivity cell.

In the preferred embodiment of the "large" cell 10, L/A was $0.66/6.6 \times 10^4 = 10^{-5}$/cm; and from Equation 2 for this cell $$N \simeq \frac{3 \times 10^7}{R_M} \quad (3)$$

The leakage resistance of the "large" cell 10 and the "dummy" cell 20 as previously mentioned at ambient temperature and 50% relative humidty (S=0.5) averaged $10^{10}$ to $10^{11}$ ohms.

Figure 6:
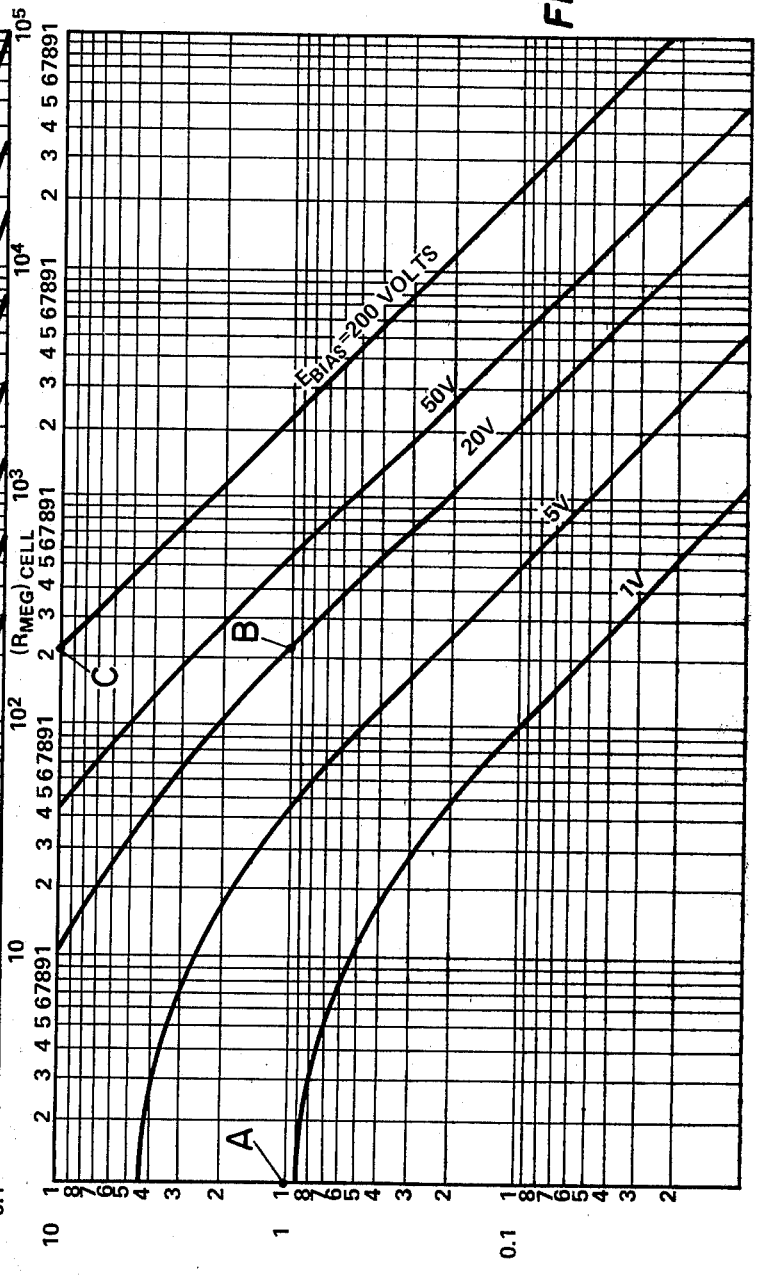
FIG. 6 is a plot of the actual values of resistance for a conductivity cell versus volmeter potential $E_M$ of FIG. 3 for various bias supply voltages varying from 1-200 volts.

FIG. 6 is a plot of a family of curves where R, the actual value cell resistance, of the "large" cell 10 is plotted against the potential $E_M$ measured on the vacuum tube voltmeter 42 at various bias source voltages $E_b$ 1-200 volts.

A graphical solution can be obtained directly from the meter voltage reading $E_b$. For example if the bias voltage $E_b$ is equal to 20 volts and the "large" cell 10 in series with the meter 42 give a reading of 1 volt one may proceed as follows:

(1) enter FIG. 6 at the left at point (A) at the 1 volt level;
(2) move to the right along the 1 volt line to the intersection at point (B) with the 20 volt bias line;
(3) then move vertically to point (C) to fine the cell resistance value of 200 megohms.
(4) from equation (3) above, N, the number of ions/cm$^3$ is equivalent to $1.5 \times 10^5$ ions/cc of moist air between the cell plates 14, 14' of conducting cell 10.

If one wishes to determine the saturation ratio (fractional relative humidity) for an observation made at 80° C., proceed as follows:

(1) move from point C vertically to the intersection with the 80° $\theta_F$ temperature line to point (D);
(2) then move horizontally to the left to point (E) to find the saturation ratio which from theory should have existed, and in this case is determined to be approximately 70% RH.

The foregoing disclosure and drawings are merely illustrative of the principles of this invention and are not to be interrupted in a limiting sense. We wish it to be understood that we do not desire to be limited to the exact details of construction shown and described for obvious modifications will occur to a person skilled in the art.

Having thus fully described the invention, what is claimed as new and desired to be secured by Letter Patent of the United States is:

1. An apparatus for determining the conductivity and number of water ion clusters in a moist air environment which comprises:
   a test chamber having a main chamber section, an access compartment section proximately disposed adjacent to said main chamber section, and glove means for permitting the changing of electrical connections within said main chamber section;
   means for introducing moist air into said main chamber section;
   first plate means proximately disposed in said test chamber for providing a comparative reference insulator leakage level;
   second plate means proximately positioned adjacent said first plate means, having a "cell factor" approximately 25 times larger than said first plate means, for collecting water ion clusters in said moist air environment;
   power supply means for applying DC voltage alternately to said first and second plates means;
   a vacuum tube voltmeter electrically connected in series with said power supply means and said first or second plate means; and
   temperature measuring means for determining the temperature of a moist air sample within said test chamber.

2. An apparatus as recited in claim 1 wherein said means for introducing moist air into said main chamber section comprises:
   a container operatively disposed in said access compartment section for heating water therein up to 100° C. in order to produce steam;
   means for introducing said steam into said main chamber section which includes;
   a slit operatively disposed in a common wall shared by said main chamber section and said access compartment section; and
   a slit cover slidably positioned on said common wall for covering said slit to seal said main chamber section from said access compartment section.

3. An apparatus as recited in claim 2 wherein said first plate means comprises:
   a plurality of rectangularly shaped steel plates alternately stacked parallel to each other, positioned first to one side and then to another side to create a square area of overlap, said steel plates having support rod holes located in each corner and a central hole located in the middle of said steel plate;

bus bar means for alternately electrically connecting said plurality of rectangularly shaped steel plates to each other; and first insulator means operatively disposed intermediate each of said plurality of rectangularly shaped plates for holding said plurality of rectangular steel plates electrically isolated from each other by a specified distance.

4. An apparatus as recited in claim 3 wherein said insulator means further comprises:

a plurality of resin-impregnated fiber support rods, having threaded ends thereon, slidably disposed in said support rod holes;

a teflon tubing operatively disposed in said central hole of said plurality of retangular steel plates; and an annularly shaped insulator spacer made of nylon material operatively disposed on each of said support rods and said teflon tubing, said insulator spacer disposed intermediate each adjacent plate of said plurality of rectangular steel plates; and a nylon nut threadedly attached to each of said threaded ends of said fiber support rods for giving said first plate means rigidity.

5. An apparatus as recited in claim 4 wherein said second plate means comprises:

a plurality of square shaped steel plates having a protruding tab extending from one corner, said square plates being operatively positioned with said protruding tab on alternate opposite top corners;

bus bar means for alternately electrically connecting said plurality of square shaped steel plates to each other; and second insulator means operatively disposed intermediate each of said plurality of square shaped plates for holding said plurality of square shaped plates electrically isolated from each other by said specified distance.

6. An apparatus as recited in claim 5 wherein said second insulator means is of the same size, shape and material of said first insulator means.

7. An apparatus as recited in claim 6 wherein said power supply means comprises:

a variable bias voltage source having a voltage indicating meter integral therewith;

a vacuum-tube voltmeter electrically connected to a first output lead of said variable bias voltage source; and a cell having a first terminal electrically connected to a second output conductor of said variable bias voltage source and a second terminal electrically connected to and in series with said vacuum-tube voltmeter.

8. A method for determining the conductivity and number of water ion clusters in a moist air environment which comprises:

placing a "dummy" cell and "large" conducting cell in an environmental test chamber;

positioning said "dummy" cell closer to a point of steam entry than said "large" conducting cell;

admitting steam into said test chamber;

shutting off steam flow into test chamber after temperature in said test chamber has risen approximately 1° centigrade above ambient temperature;

sealing said test chamber at atmospheric pressure;

heating said test chamber until a desired humidity is obtained;

allowing said test chamber to equilibrate;

electrically connecting a variable D.C. power source to bus bars of said "dummy" cell with a high impedance vacuum-tube voltmeter in series therewith;

setting said variable D.C. bias source to a first specified output voltage level;

recording the potential indicated by said vacuum-tube voltmeter; calculating the voltage drop across said "dummy" cell by substracting the potential indicated by said vacuum-tube voltmeter from said first specified output voltage level;

electrically disconnecting said "dummy" cell and reconnecting said "large" conducting cell in series with said vacuum-tube voltmeter and said variable D.C. bias source;

resetting said variable D.C. power source to a second specified output voltage level;

recording the potential indicated by said vacuum-tube voltmeter;

calculating the value of the voltage drop across said "large" conducting cell by substracting the potential indicated by said vacuum-tube voltmeter from said second specified output voltage level;

compensating the value of the voltage drop across said "large" conducting cell by substracting the voltage drop calculated across said "dummy" or reference cell;

calculating the cell resistance of said "large" cell by taking the ratio of the compensated value of voltage drop across said "large" cell divided by said second specified output voltage level multiplied by the input impedance of said vacuum-tube voltmeter.

9. A method as recited in claim 8 wherein said step of setting said variable D.C. bias source to a first specified output voltage includes:

limiting said setting of said variable D.C. bias source to a first specified output level below 200 volts.

10. A method as recited in claim 9 wherein said step of resetting said variable D.C. power source to a second specified output voltage level includes:

limiting said resetting of said variable D.C. power source to a second specified output voltage level below 200 volts.

11. A method as recited in claim 8, 9 or 10 wherein said step of placing a "dummy" cell and "large" conducting cell in an environmental test chamber includes:

selecting said "large" conducting cell with a cell factor or ratio of cell plates to area which is at least 25 times smaller than a cell factor of said "dummy" cell.

* * * * *